United States Patent
Inaba et al.

(10) Patent No.: US 11,097,379 B2
(45) Date of Patent: Aug. 24, 2021

(54) SOLDER BONDING METHOD AND SOLDER JOINT

(71) Applicant: Lenovo (Singapore) Pte. Ltd., Singapore (SG)

(72) Inventors: Ko Inaba, Tokyo (JP); Tetsu Takemasa, Tokyo (JP); Tadashi Kosuga, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 272 days.

(21) Appl. No.: 16/277,906

(22) Filed: Feb. 15, 2019

(65) Prior Publication Data
US 2019/0193211 A1  Jun. 27, 2019

Related U.S. Application Data

(63) Continuation of application No. PCT/IB2018/000025, filed on Jan. 19, 2018.

(30) Foreign Application Priority Data

Jan. 20, 2017  (JP) ............................ JP2017-009017

(51) Int. Cl.
*B23K 35/26* (2006.01)
*B23K 1/00* (2006.01)
(Continued)

(52) U.S. Cl.
CPC ............... *B23K 35/26* (2013.01); *B23K 1/00* (2013.01); *B23K 1/008* (2013.01); *B23K 1/0016* (2013.01);
(Continued)

(58) Field of Classification Search
None
See application file for complete search history.

(56) References Cited

U.S. PATENT DOCUMENTS

| 5,316,205 A | * | 5/1994 | Melton | ................ | H05K 3/3426 |
| | | | | | 228/180.21 |
| 5,611,481 A | * | 3/1997 | Akamatsu | ............ | H05K 3/3436 |
| | | | | | 228/180.22 |

(Continued)

FOREIGN PATENT DOCUMENTS

| JP | H08-150493 A | 6/1996 |
| JP | 2000-307228 A | 11/2000 |

(Continued)

OTHER PUBLICATIONS

International Search Report issued in corresponding International Patent Application No. PCT/IB2018/000025, dated May 1, 2018 (2 pages).

(Continued)

*Primary Examiner* — Devang R Patel
(74) *Attorney, Agent, or Firm* — Osha Bergman Watanabe & Burton LLP

(57) ABSTRACT

A solder bonding method that bonds, using a solder joint, an electrode of a circuit board to an electrode of an electronic component includes: depositing, on the electrode of the circuit board, an Sn—Bi-based solder alloy with a lower melting point than a solder alloy deposited on the electrode of the electronic component; mounting the electronic component on the circuit board such that the Sn—Bi-based solder alloy contacts the solder alloy on the electrode of the electronic component; heating the circuit board to a peak temperature of heating of 150° C. to 180° C.; holding the peak temperature of heating at a holding time of greater than 60 seconds and less than or equal to 150 seconds; and cooling, after the heating and to form the solder joint, the circuit board at a cooling rate greater than or equal to 3° C./sec.

7 Claims, 3 Drawing Sheets

(51) Int. Cl.
*H01L 25/07* (2006.01)
*C22C 12/00* (2006.01)
*H05K 3/34* (2006.01)
*H01L 25/18* (2006.01)
*C22C 13/02* (2006.01)
*B23K 1/20* (2006.01)
*B23K 1/008* (2006.01)
*C22C 13/00* (2006.01)
*B23K 101/42* (2006.01)

(52) U.S. Cl.
CPC .............. *B23K 1/203* (2013.01); *C22C 12/00* (2013.01); *C22C 13/00* (2013.01); *C22C 13/02* (2013.01); *H01L 25/07* (2013.01); *H01L 25/18* (2013.01); *H05K 3/34* (2013.01); *H05K 3/3463* (2013.01); *B23K 2101/42* (2018.08)

(56) References Cited

U.S. PATENT DOCUMENTS

| | | | | |
|---|---|---|---|---|
| 6,184,475 | B1* | 2/2001 | Kitajima | B23K 35/025 174/257 |
| 7,806,994 | B2 | 10/2010 | Smith et al. | |
| 2003/0121959 | A1* | 7/2003 | Yamaguchi | B23K 35/007 228/256 |
| 2006/0227510 | A1 | 10/2006 | Fitzgerald et al. | |
| 2007/0228109 | A1 | 10/2007 | Smith et al. | |
| 2015/0305167 | A1* | 10/2015 | Nakanishi | H05K 3/3457 174/257 |

FOREIGN PATENT DOCUMENTS

| | | | |
|---|---|---|---|
| JP | 2009-010300 A | | 1/2009 |
| JP | 2015-149418 A | | 8/2015 |
| JP | 2015149418 A | * | 8/2015 |
| JP | 2016-043408 A | | 4/2016 |
| JP | 2016-083695 A | | 5/2016 |
| WO | 2005-122252 A1 | | 12/2005 |

OTHER PUBLICATIONS

Written Opinion issued in corresponding International Patent Application No. PCT/IB2018/000025, dated May 1, 2018 (4 pages).
European Search Report issued in corresponding European Patent Application No. 18741225.9 dated Nov. 21, 2019 (4 pages).

* cited by examiner

COMPARATIVE EXAMPLE 1

EXAMPLE 1

COMPARATIVE EXAMPLE 2

EXAMPLE 2

COMPARATIVE EXAMPLE 3

EXAMPLE 3

SOLDER BONDING METHOD AND SOLDER JOINT

TECHNICAL FIELD

The present invention relates to a solder bonding method for bonding a circuit board and an electronic component by forming a solder join that exhibits excellent connection reliability and a solder joint.

BACKGROUND

In recent years, with miniaturization and thinning of electronic devices, high integration of electronic components mounted on electronic devices has been demanded. High density mounting is necessary for high integration of electronic components. Flip-chip mounting using BGA, for example, is an example of such a high density mounting method.

Flip-chip mounting is a method in which electronic components are mounted on a printed circuit board and solder bumps on the printed circuit board and the BGA are melted and bonded by reflow. Since a large number of solder bumps are formed on the printed circuit board, heating is performed in reflow to such a high temperature that the solder alloy is sufficiently melted to form a solder joint without a defective connection. Therefore, the printed circuit board and the BGA are exposed to such a high temperature. Since the solidus temperature of the commonly-used SnAgCu solder alloy is about 220° C., the printed circuit board and the BGA are conventionally exposed to a higher temperature than this temperature during reflow.

Under such conditions, thermal warpage of the circuit board may occur. Stress may concentrate on the solder joint during cooling after reflow due to the difference in coefficient of thermal expansion between the printed circuit board and the BGA, and the solder joint may break. Moreover, reflow at high temperature may result in high manufacturing costs.

In view of the above, a proposal has been made on low-temperature bonding. For example, the Patent Document 1 proposes a solder bonding method in which a high-melting-point solder alloy layer is formed on the BGA side, a low-melting-point alloy layer is formed on the printed circuit board side, these layers are brought into contact with each other, and thereafter, heating is performed in a temperature range of the melting point of the low-melting-point solder alloy or more and less than the melting point of the high-melting-point solder alloy. This method allows the high-melting-point solder alloy to remain by heating in the temperature range and achieves bonding between the low-melting-point alloy layer and the high-melting-point alloy layer by melt diffusion, thereby avoiding thermal damage to the circuit board. In addition, Patent Document 1 describes an example in which heating of holding the temperature at 190° C. for 40 seconds is performed. Further, Patent Document 1 shows Sn-58Bi as an example of the low-melting-point solder alloy.

PATENT DOCUMENT

Patent Document 1: Japanese Unexamined Patent Application Publication No. 2000-307228

However, if the heating temperature is 190° C., it is insufficient to prevent thermal damage to the electronic components, and it is necessary to further lower the heating temperature. However, the invention described in Patent Document 1 is intended to provide a bonding method by which a good bonding part can be obtained by a heating process almost the same as that of tin-lead eutectic solder. Then, the bonding method described in Patent Document 1 achieves bonding by melt diffusion of the low-melting-point alloy, which is a second alloy layer. That is, a heating temperature of 190° C. or more is necessary to form a 63Sn-37Pb eutectic alloy layer having a melting point of 183° C. Therefore, if the heating temperature is lowered, it becomes difficult to achieve the bonding by melt diffusion described in Patent Document 1.

Patent Document 1 further describes that heating at a still higher temperature for a longer period of time is required to equalize the elemental distribution in the solder joint. However, heating at a higher temperature requires cooling time. Thus, the intermetallic compound layer at the connection interface and the crystal phase of the solder alloy constituting the solder joint grow, and an applied stress is concentrated at the interface of the intermetallic compound layer and the interface of the crystal phase. This may result in breakage of the solder joint from the bonding interface or the region near the bonding interface where stress is most concentrated at the time of cooling after heating. It is also conceivable to make the alloy composition of the solder alloy such that the growth of the intermetallic compound is prevented. However, the composition is limited, and there is a limit to prevention of the growth of the intermetallic compound depending on the heating temperature and time. Especially, Sn-58Bi is used as a low-melting-point solder alloy in Patent Document 1, and Bi in the eutectic portion has properties of being hard and brittle. Thus, breakage of the solder joint is remarkable.

On the other hand, Patent Document 1 describes setting solder bonding conditions to a relatively low temperature and a relatively short time so as to cause the high-melting-point alloy layer to remain because sufficient bonding reliability can be obtained even if the high-melting-point alloy layer remains. This case makes it difficult for the structure of the solder joint to become uniform, resulting in breakage of the solder joint.

SUMMARY

One or more embodiments of the present invention provide a solder bonding method for bonding an electrode of a circuit board and an electrode of an electronic component by forming a solder joint with excellent connection reliability while reducing thermal damage to the electronic component.

According to one or more embodiments, an Sn—Bi-based low-melting-pint solder alloy may be used as a solder alloy in an electrode on the circuit board side and lowering the heating temperature from the viewpoint of preventing thermal damage to an electronic component in a configuration of forming a high-melting-point solder alloy on the electronic component side and forming a low-melting-point solder alloy on the printed circuit board side.

Furthermore, according to one or more embodiments, the heating time may be set to be longer than conventional methods to obtain better connection reliability by uniformizing the structure even if the heating temperature is lowered. Conventionally, the heating time is usually set to be shortened because heating for a long period of time causes an increase in manufacturing costs.

Conventionally, from the viewpoint of reducing residual stress caused by the difference in thermal expansion between the printed circuit board and the electronic component, the cooling rate after reflow has to be reduced to 2° C./s or less.

However, according to one or more embodiments, as the cooling rate is reduced, the Bi phase of the solder alloy becomes coarse, so the connection reliability of the solder joint is reduced.

According to one or more embodiments of the present invention, by intentionally increasing the cooling rate after reflow while lowering the reflow temperature compared with the conventional reflow temperature and heating for a longer period of time than the conventional time, thermal damage to an electronic component is prevented, and the melt diffusion between the high-melting-point solder alloy on the electronic component side and the low-melting-point solder alloy on the circuit board side and the melt diffusion between the low-melting-point solder alloy and the electrode are sufficiently performed. Furthermore, the growth of the intermetallic compound layer at the bonding interface on the circuit board side is prevented, and at the same time the Sn—Bi-based low-melting-point solder alloy becomes finer, and the stress concentration at the bonding interface and the crystal interface is prevented, whereby excellent connection reliability can be secured. In addition, since the heating temperature is lowered, the residual stress due to the difference in thermal expansion of the circuit board is reduced, whereby excellent connection reliability of the solder joint is maintained even when rapid cooling is performed after heating.

The solder bonding method for bonding an electrode of a circuit board and an electrode of an electronic component by forming a solder joint, according to one or more embodiments of the present invention, includes the steps of: forming, on the electrode of the circuit board, an Sn—Bi-based solder alloy having a lower melting point than a solder alloy formed on the electrode of the electronic component; mounting the electronic component on the circuit board such that the solder alloy formed on the electrode of the circuit board and the solder alloy formed on the electrode of the electronic component come into contact with each other; heating the circuit board to a peak temperature of heating of 150° C. to 180° C. with a holding time of the peak temperature of heating of more than 60 seconds and 150 seconds or less; and cooling the circuit board at a cooling rate after the heating of 3° C./sec or more to form a solder joint.

The peak temperature of heating may be lower than the melting point of the solder alloy formed on the electrode of the electronic component.

In the solder joint, the proportion of the number of Bi phases each having an area of 0.5 µm² or less in the number of Bi phases each having an area of 5 µm² or less may be 60% or more on average.

The Sn—Bi-based solder alloy may be at least one kind of an Sn—Bi solder alloy, an Sn—Bi—Cu solder alloy, an Sn—Bi—Ni solder alloy, an Sn—Bi—Cu—Ni solder alloy, an Sn—Bi—Ag solder alloy, and an Sn—Bi—Sb solder alloy.

The Bi content in the Sn—Bi-based solder alloy may be 30 to 80 mass %.

The solder alloy formed on the electrode of the electronic component may be at least one kind of an Sn—Cu solder alloy, an Sn—Ag solder alloy, an Sn—Ag—Cu solder alloy, an Sn—Ag—Cu—Ni solder alloy, an Sn—Ag—Cu—Sb solder alloy, and an Sn—Ag—Cu—Ni—Sb solder alloy.

The temperature difference between the melting point of the solder alloy formed on the electrode of the circuit board and the melting point of the solder alloy formed on the electrode of the electronic component may be 30° C. or more.

The Sn—Bi-based solder alloy may contain 58 mass % of Bi and the balance of Sn.

In the solder joint according to one or more embodiments of the present invention, which bonds an electrode of a circuit board and an electrode of an electronic component, an Sn—Bi-based solder alloy having a lower melting point than a solder alloy formed on the electrode of the electronic component is formed on the electrode of the substrate, and in the solder joint, the proportion of the number of Bi phases each having an area of 0.5 µm² or less in the number of Bi phases each having an area of 5 µm² or less is 60% or more on average.

BRIEF DESCRIPTION OF THE DRAWINGS

Specifically, FIG. 2A is an SEM photograph of the breakage surface of the solder joint formed under the conditions of Comparative Example 1.

FIG. 2B is an SEM photograph of the breakage surface of the solder joint formed under the conditions of Example 1 of one or more embodiments of the present invention.

FIG. 2C is an SEM photograph of the breakage surface of the solder joint formed under the conditions of Comparative Example 2.

FIG. 2D is an SEM photograph of the breakage surface of the solder joint formed under the conditions of Example 2 of one or more embodiments of the present invention.

FIG. 2E is an SEM photograph of the breakage surface of the solder joint formed under the conditions of Comparative Example 3.

FIG. 2F is an SEM photograph of the solder joint formed under the conditions of Example 3 of one or more embodiments of the present invention.

DETAILED DESCRIPTION

Figure 1:
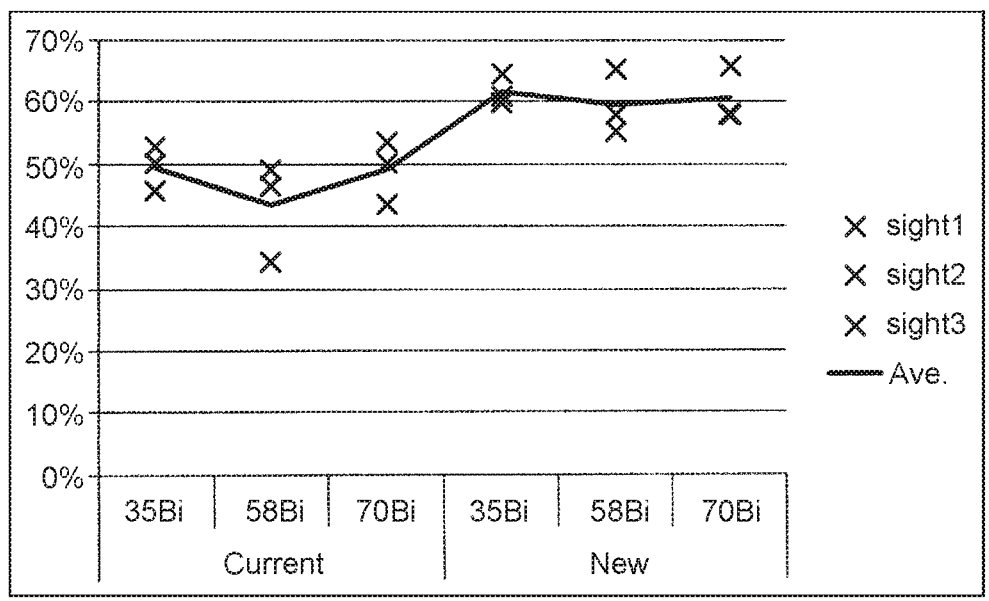
FIG. 1 is a graph showing the relationship between the Bi content in the solder joint and the proportion of the number of Bi phases each having an area of 0.5 µm² or less in the number of Bi phases each having an area of 5 µm² or less in the case where the temperature profile is changed after heating.

The present invention is described in detail below with reference to the following embodiments, which are mere examples, and the present invention is not necessarily limited thereby. In the specification below, "%" as to solder alloy composition indicates "mass %" unless otherwise specifically indicated.

1. Basic Structure of Solder Joint

The solder bonding method according to one or more embodiments of the present invention is for bonding an electrode of a circuit board and an electrode of an electronic component by forming a solder joint.

The solder joint formed by the solder bonding method of one or more embodiments has a bonding structure of bonding an electrode of a circuit board and an electrode of an electronic component. The circuit board to be used in one or more embodiments is a so-called printed circuit board, and a paste has been applied to the electrode of the circuit board. Bumps using solder bolls are formed on the electrode of the electronic component. The solder joint formed by the solder bonding method of one or more embodiments is formed by bonding the paste applied to the electrode of the circuit board and the solder bumps formed on the electrode of the electronic component when the electronic component is mounted on the circuit board.

The circuit board used in one or more embodiments is a conventional printed circuit board, and for example, a paper phenol circuit board or a glass-epoxy circuit board can be used. A Cu electrode is mainly used as the electrode. The electrode may be Ni-plated.

Next, each step will be described in detail.

2. Step of Forming (i.e., Depositing), on the Electrode of the Circuit Board, an Sn—Bi-Based Solder Alloy having a Lower Melting Point than a Solder Alloy formed (i.e., Deposited) on the Electrode of the Electronic Component (1) Method for Forming Solder Alloy In the solder bonding method of one or more embodiments, first, a solder alloy is formed on each of an electrode of a circuit board and an electrode of an electronic component. A high-melting-point solder alloy that does not melt at a reflow temperature is formed on the electrode of the electronic component, and an Sn—Bi-based low-melting-point solder alloy that melts at a reflow temperature is formed on the electrode of the circuit board.

Specifically, for example, a mask is placed on the electrode of the circuit board, and a paste on the mask is coated to the electrode of the circuit board through an opening of the mask while moving a squeegee. Alternatively, the paste may be applied to the electrode by a discharge method or pre-coating. The coating thickness is not particularly limited and may be 0.05 to 0.2 mm. The components of the paste other than a solder alloy powder may be those conventionally used and are not particularly limited. The flux used in the solder paste may be either a water-soluble flux or a water-insoluble flux. A rosin-based flux, which is a rosin-based water-insoluble flux, is generally used.

On the electrode of the electronic component, bumps are formed by mounting solder balls having a diameter of 100 to 1000 μm depending on a diameter of the electrode.

(2) Alloy Composition of Solder Alloy Formed on Electrode of Circuit Board

An Sn—Bi-based solder alloy having a lower melting point than a solder alloy formed on the electrode of the electronic component is formed on the electrode of the circuit board to be used in one or more embodiments. Such low-melting-point solder alloy is necessary for low-temperature bonding to prevent thermal damage to the circuit board. Accordingly, the solder alloy used on the circuit board side of one or more embodiment may have a low melting point (liquidus temperature) of 150° C. or less. Such an Sn—Bi-based solder alloy can be at least one kind of Sn—Bi solder alloys, Sn—Bi—Cu solder alloys, Sn—Bi—Ni solder alloys, Sn—Bi—Cu—Ni solder alloys, Sn—Bi—Ag solder alloys, and an Sn—Bi—Sb solder alloys.

When Cu or Ni is added to the Sn—Bi solder alloy, the Cu content may be 0.1% to 1.0%, and the Ni content may be 0.01% to 0.1%. These Sn—Bi—Cu solder alloy, Sn—Bi—Ni solder alloy, and Sn—Bi—Cu—Ni solder alloy can prevent the growth of intermetallic compound at the bonding interface of the solder joint, so that excellent connection reliability can be maintained even when heating is performed for a long period of time as in one or more embodiments. The solder alloy may further contain Ag or Sb in a range in which the melting point of the solder alloy becomes 150° C. or less.

In addition, the Bi content may be 30% to 80% in alloy composition of each of these alloys. When the Bi content is in the above-described range, the melting point (solidus temperature) is constant at 138° C. Therefore, when an alloy having such Bi content is used for solder bumps on the circuit board, the solder alloy formed on the electrode of the circuit board starts melting when heated, and the bumps of the electronic component can form a solder joint while pressing the bumps of the circuit board by the self-weight of the electronic component. In addition, the Bi content may be 35% to 70% or 53% to 61% from the viewpoint of shifting the liquidus temperature to a low temperature to lower the heating temperature and further reducing the thermal damage to the electronic component and the circuit board.

The Sn—Bi-based solder alloy is particularly preferably an alloy having 58% of Bi and the balance of Sn as eutectic composition. Since this alloy composition is eutectic composition, it becomes a liquid phase at a temperature of 138° C. or higher, and thus a solder joint can be easily formed at a low temperature.

(3) Alloy Composition of Solder Alloy Formed on Electrode of Electronic Component The solder alloy formed on the electrode of the electronic component is preferably, for example, at least one kind of an Sn—Cu solder alloy, an Sn—Ag solder alloy, an Sn—Ag—Su solder alloy, an Sn—Ag—Cu—Ni solder alloy, an Sn—Ag—Cu—Sb solder alloy, and an Sn—Ag—Cu—Ni—Sb solder alloy.

These solder alloys preferably have such melting points that they do not melt at the time of reflow and may have melting points (solidus temperatures) of 200° C. or more.

(4) Temperature Difference in Melting Point Between Solder Alloys

The temperature difference between the melting point (liquidus temperature) of the solder alloy formed on the electrode of the circuit board and the melting point (solidus temperature) of the solder alloy formed on the electrode of the electronic component may be 30° C. or more. When the temperature difference is 30° C. or more, the solder alloy formed on the electrode of the electronic component does not melt even considering the error in temperature control. The temperature difference in melting point is more preferably 40° C. or more, yet more preferably 50° C. or more. For example, the liquidus temperature and solidus temperature can be measured using DSC.

3. Step of Mounting the Electronic Component on the Circuit Board such that the Solder Alloy Formed on the Electrode of the Circuit Board and the Solder Alloy Formed on the Electrode of the Electronic Component come into Contact with Each Other.

Next, the electronic component is mounted on the circuit board such that the electrode of the circuit board and the electrode of the electronic component come into contact with each other. The electronic component with bumps formed thereon is supplied by a feeder, and the electronic component is mounted on the circuit board by a component mounting apparatus. Examples of the system of the component mounting apparatus include a one-by-one system, an in-line system, and a multisystem.

4. Step of Heating the Circuit Board to a Peak Temperature of Heating of 150° C. to 180° C. with a Holding Time of the Peak Temperature of Heating of More than 60 Seconds and 150 Seconds or Less (1) Peak Temperature of Heating The circuit board on which the electronic component is mounted is introduced into a reflow furnace, and the circuit board is heated at a peak temperature of heating of 150° C.

to 180° C. during reflow. This temperature range may be lower than the melting point of the solder alloy formed on the electrode of the electronic component. That is, this temperature range may be a temperature range in which the solder alloy formed on the electrode of the circuit board melts, and the solder alloy formed on the electrode of the electronic component does not melt. In this temperature range, thermal damage to the circuit board and the electronic component can be prevented. In addition, since the heating temperature is kept low, the influence of the difference in coefficient of thermal expansion among the circuit board, the electronic component, and the solder alloy is reduced, whereby stress concentration at the solder joint during rapid cooling can be prevented.

If the peak temperature of heating is less than 150° C., the Bi phase is segregated, and a microstructure cannot be obtained. In addition, the melt diffusion is insufficient, and therefore, the bonding between the electrode and the solder alloy or the bonding between the high-melting-point solder alloy and the low-melting-point solder alloy may not be completed, resulting in breakage of the solder joint in some cases. On the other hand, if the peak temperature of heating exceeds 180° C., thermal damage to the electronic component and the circuit board may occur. Therefore, the peak temperature of heating is preferably 165° C. to 180° C.

(2) Holding Time

The holding time of the peak temperature of heating is more than 60 seconds and 150 seconds or less. Conventionally, the holding time is suppressed to at most about 40 seconds from the viewpoint of shortening the manufacturing time and reducing the costs. However, in one or more embodiments, in order to improve connection reliability of the solder joint, a sufficient melting time is ensured by heating for a long period of time, which has been avoided conventionally. Thus, the structure is uniformized, and the melt diffusion is sufficiently performed. In the solder bonding method of one or more embodiments, the peak temperature of heating is kept low as mentioned above. Thus, the growth of the intermetallic compound layer at the bonding interface can be prevented, and the crystal grain size of the solder alloy can be reduced even if the holding time is lengthened. As a result, excellent connection reliability can be obtained.

If the holding time is 60 seconds or less, the Bi phase segregates at the time of solidification, and the melt diffusion is insufficient, so that the bonding is not completed. Therefore, if the cooling rate is high, the solder joint breaks due to the difference in coefficient of thermal expansion among the circuit board, the electronic component, and the solder alloy, as mentioned below. On the other hand, if the holding time exceeds 150 seconds, the manufacturing time becomes too long, which is not preferable. The holding time of the peak temperature of heating is more preferably 90 to 120 seconds from the viewpoint of reliably melting and diffusing and not reducing the productivity.

In order to remove the solvent in the paste, preheating may be performed at a temperature in the range of 50° C. to 100° C. before introducing the circuit board into the reflow furnace.

5. Step of Cooling the Circuit Board at a Cooling Rate After the Heating of 3° C./Sec or More to Form a Solder Joint.

The circuit board is cooled from the heating temperature to room temperature at a cooling rate after the heating in the range of 3° C./sec or more. Conventionally, cooling after reflow is performed by air-cooling, and this cooling is performed at a cooling rate of approximately 1° C./sec. This is to avoid stress concentration at the solder joint due to the difference in coefficient of thermal expansion among the circuit board, the electronic component, and the solder alloy. However, in one or more embodiments, by separately providing a cooling means in the reflow furnace to increase the cooling rate of the circuit board, growth of the intermetallic compound layer at the bonding interface is prevented, and at the same time the Bi phase in the Sn—Bi-based low-melting-point solder alloy becomes fine, and stress concentration at the bonding interface and the crystal interface is prevented, whereby excellent connection reliability can be ensured. In addition, since the heating temperature is lowered, residual stress due to the difference in thermal expansion of the circuit board is reduced, whereby excellent connection reliability of the solder joint can be maintained even when rapid cooling is performed after heating.

When the cooling rate is less than 3° C./sec, it takes time to cool, so that the Bi phase becomes coarse as the intermetallic compound layer grows. On the other hand, the upper limit of the cooling rate is preferably 7° C./sec or less, more preferably 5° C./sec or less, yet more preferably 4° C./sec or less from the viewpoint of cooling equipment.

The means for increasing the cooling rate is not particularly limited, and the circuit board may be cooled by cold air using a compressor or the like, or may be cooled by pressing a cooling medium against the circuit board. However, cooling using a compressor is preferable from the viewpoint of ensuring a stable cooling rate.

In the solder bonding method according to one or more embodiments, bonding is performed at a lower temperature than that in the conventional method, whereby the damage to the circuit board and the electronic component can be prevented. Further, the damage to the heating element of the reflow furnace can also be prevented, whereby the costs can be reduced.

6. Solder Joint

In observation of the cross section of the solder joint formed by the solder bonding method according to one or more embodiments, the proportion of the number of Bi phases each having an area of 0.5 $\mu m^2$ or less in the number of Bi phases each having an area of 5 $\mu m^2$ or less in any region on the electrode side of the circuit board may be 60% or more on average. In one or more embodiments, excellent connection reliability that has not been achieved conventionally can be achieved by focusing on the structure of the low-melting-point solder alloy and controlling the structure of the solder alloy by setting the heating conditions and the cooling conditions to predetermined ranges as mentioned above. In order to achieve this, it is necessary to focus on the area of the Bi phase, which is essential for the low-melting-point solder alloy. That is, if the number of fine Bi phases each having a small area is larger than the number of coarse Bi phases each having a large area in observation of the cross section of the solder joint, a large number of fine Bi phases are present, and therefore, the microstructure can be obtained.

Therefore, in one or more embodiments in which the fine Bi phase is achieved, even when a large stress is applied, the stress is dispersed. Thus, even if a circuit board and an electronic component having coefficients of thermal expansion largely different from each other are used, the stress can be relieved to such an extent that the circuit board and the electronic component do not break.

The solder joint capable of exhibiting such effect is required to have an alloy structure having a large number of Bi phases each having an area of 0.5 $\mu m^2$ or less. In order to make the above effect more sufficiently exhibited, the proportion of the number of Bi phases each having an area of 0.5 μm² or less in the number of Bi phases each having an area of 5 μm² or less may be 60% or more on average or 65% or more on average.

The solder joint according to one or more embodiments may have an intermetallic compound layer of 3 to 5 μm in the vicinity of the bonding interface with the electrode.

EXAMPLES

1. Production of Solder Joint

Table 1 summarizes alloy composition of a solder alloy formed on a Cu electrode of a circuit board, heating conditions, and cooling conditions. The circuit board used in the present examples was an FR-4 glass-epoxy circuit board with an electrode diameter of 325 μm, a side length of 105 mm, and a plate thickness of 0.8 mm. On this circuit board, an electronic component (BGA) with a Cu electrode, having an electrode diameter of 450 μm and a side length of 20 mm, was mounted. The alloy composition of the solder alloy formed on the electrode of BGA (referred to as "Device" in Table 1) was SAC405 (Sn-4Ag-0.5 Cu (Ag: 4%, Cu: 0.5%, Sn: the balance), solidus temperature: 217° C.) as summarized in Table 1, and bumps were formed on the electrode using solder balls with a diameter of 290 μm. The alloy composition of the solder alloy formed on the electrode of the circuit board is as summarized in Table 1. In the alloy composition described in the column "Alloy Composition" in Table 1, the numerical value described right before the element represents the content (mass %), and the balance other than Bi, Cu, and Ni represents Sn. It was confirmed by DSC that the liquidus temperature of each solder alloy on the circuit board side was lower than the solidus temperature on the BGA side. The liquidus temperature of Sn-58Bi was 141° C., the liquidus temperature of Sn-35Bi-0.5Cu-0.03Ni was 184° C., and the liquidus temperature of Sn-70Bi-0.5Cu-0.03Ni was 180° C. The solidus temperature and the liquidus temperature were determined from the DSC curve obtained by increasing the temperature at 5° C./min in the atmosphere using a DSC (Model No. Q2000) manufactured by TA Instruments Japan, Inc.

A solder paste containing solder alloy powder of this alloy composition was applied to the electrode of the circuit board to have a thickness of 100 μm. Then, the circuit board was heated and cooled under the conditions summarized in Table 1 to form a solder joint having a thickness of 200 μm. The heating temperature and the cooling rate were measured by attaching a thermocouple to the circuit board.

As a method of cooling the solder alloy, in the examples and Comparative Examples 5 and 6, the surface of the circuit board after heating, opposite to the surface on which the BGA was mounted was rapidly cooled by pressing it against a cooling agent, and in Comparative Examples 1 to 4, the circuit board was cooled in the atmosphere. The cooling rate was determined by measuring the temperature and time until the circuit board was cooled to room temperature by bringing the thermocouple into contact with the circuit board.

2. Observation of Breakage Surface of Solder Joint

An SEM photograph of the breakage surface of the formed solder joint was taken with a scanning electron microscope (JSM-5600LV manufactured by Nippon Electronics Co., Ltd.) at 1000× magnification with the observation mode as the BEI. Three regions of 128 μm×96 μm were arbitrarily selected from the region near the bonding interface of the solder joint, and the area of the Bi phase at each of three locations was determined. The area of the Bi phase was determined by assuming that, in the SEM photograph, a portion of 1 dot had 0.04 μm², a portion of up to 2 dots was a noise, and a white portion of three dots having 0.12 μm² or more was determined as the Bi phase. Among the determined areas of the Bi phases, the one having the area of 0.5 μm² or less was determined as the fine Bi phase. The proportion of the number of Bi phases each having an area of 0.5 μm² or less in the number of Bi phases each having an area of 5 μm² or less in each region was measured, and each average was determined.

3. Connection Reliability Test

A strain gauge was attached to the four corners of the BGA using the mounting circuit board on which the solder joint was formed as described in the item 1 above, and the bending test was repeatedly performed while monitoring the strain amount at all times. In order to evaluate the results of the bending test, the bonding impedance (Ω) between the BGA and the circuit board was measured, and the number of cycles at which the impedance increased by 10% or more from the initial value was measured.

The number of bending cycles at a strain amount of 1000μ Strain of 100000 was set to the maximum number of bending cycles for the mounting circuit board on which the used electronic component (BGA) was mounted. If the maximum number of bending cycles was achieved, it was determined that there was no problem even if the electronic component was used for the products, so the solder joint was evaluated as "○". If the number of bending cycles was less than 100000, the solder joint was evaluated as "×". The bending test was conducted based on "IPC/JEDEC-9707 Spherical Bend Test Method for board level Interconnects".

The results of the measurements are shown in Table 1.

TABLE 1

| | Alloy Composition | | Peak | | | Degree of fine geometry | | | | |
|---|---|---|---|---|---|---|---|---|---|---|
| | Device | Paste | Temp. | Keep | Cooling | Bump 1 | Bump 2 | Bump 3 | Ave. | Bending test result |
| Ex. 1 | SAC405 | Sn—35Bi—0.5Cu—0.03Ni | 180 | 120 | 4 | 64.5 | 61.0 | 59.7 | 62 | ○ |
| Ex. 2 | SAC405 | Sn—58Bi | 180 | 120 | 4 | 65.4 | 58.1 | 55.3 | 60 | ○ |
| Ex. 3 | SAC405 | Sn—70Bi—0.5Cu—0.03Ni | 180 | 120 | 4 | 65.8 | 58.4 | 57.9 | 61 | ○ |
| Ex. 4 | SAC405 | Sn—58Bi | 165 | 120 | 4 | 62.7 | 64.8 | 61.4 | 63 | ○ |
| Ex. 5 | SAC405 | Sn—58Bi | 150 | 120 | 4 | 64.6 | 66.4 | 60.9 | 64 | ○ |
| Ex. 6 | SAC405 | Sn—58Bi | 180 | 120 | 3 | 60.5 | 67.8 | 67.6 | 65 | ○ |
| Ex. 7 | SAC405 | Sn—58Bi | 180 | 120 | 7 | 73.8 | 73.5 | 71.5 | 73 | ○ |
| Ex. 8 | SAC405 | Sn—58Bi | 180 | 150 | 4 | 72.3 | 73.3 | 66.7 | 71 | ○ |
| Comp. Ex. 1 | SAC405 | Sn—35Bi—0.5Cu—0.03Ni | 180 | 30 | 1 | 52.7 | 50.1 | 45.8 | 50 | x |
| Comp. Ex. 2 | SAC405 | Sn—58Bi | 180 | 30 | 1 | 49.2 | 46.6 | 34.2 | 43 | x |
| Comp. Ex. 3 | SAC405 | Sn—70Bi—0.5Cu—0.03Ni | 180 | 30 | 1 | 53.7 | 50.2 | 43.6 | 49 | x |
| Comp. Ex. 4 | SAC405 | Sn—58Bi | 180 | 120 | 1 | 58.1 | 46.3 | 56.9 | 54 | x |

TABLE 1-continued

| | Alloy Composition | | Peak | | | Degree of fine geometry | | | | Bending test result |
|---|---|---|---|---|---|---|---|---|---|---|
| | Device | Paste | Temp. | Keep | Cooling | Bump 1 | Bump 2 | Bump 3 | Ave. | |
| Comp. Ex. 5 | SAC405 | Sn—58Bi | 180 | 30 | 4 | 47.4 | 43.6 | 47.0 | 46 | x |
| Comp. Ex. 6 | SAC405 | Sn—58Bi | 180 | 60 | 4 | 58.0 | 60.2 | 59.7 | 59 | x |

As is evident from Table 1, the solder joints formed by the reflow profiles of the examples showed the results of the proportion of the number of Bi phases each having an area of 0.5 $\mu m^2$ or less in the number of Bi phases each having an area of 5 $\mu m^2$ or less of 60% or more on average. This demonstrates that sufficiently fine Bi phases were obtained by rapid cooling after heating. The results of the repeated bending test mentioned in the item 3 above showed that 100000 cycles, which is the maximum number of bending cycles were achieved.

In contrast, the solder joints formed under the conditions of the comparative examples only showed the results of the proportion of the number of Bi phases each having an area of 0.5 $\mu m^2$ or less in the number of Bi phases each having an area of 5 $\mu m^2$ or less of below 60% on average. In the connection reliability test mentioned in the item 3 above, none of the compositions achieved 100000 cycles because the impedance increased by 10% or more at the time when 100000 cycles were not achieved.

In Comparative Examples 1 to 4, the number of bending cycles was small because the cooling rate was slow, and sufficiently fine Bi phase could not be obtained. In Comparative Examples 5 and 6, the Bi phase was segregated to have low degree of fine geometry because the holding time of heating was short, and the number of bending cycles was small.

Some of the results of Table 1 are extracted and shown in FIG. 1. FIG. 1 is a graph showing the relationship between the Bi content in the solder joint and the proportion of the number of Bi phases each having an area of 0.5 $\mu m^2$ or less in the number of Bi phases each having an area of 5 $\mu m^2$ or less in the case where the temperature profile is changed after heating. In FIG. 1, the vertical axis indicates the proportion of the number of Bi phases each having an area of 0.5 $\mu m^2$ or less in the number of Bi phases each having an area of 5 $\mu m^2$ or less, and the horizontal axis indicates the Bi content in the solder alloy formed on the electrode of the circuit board. As the specific alloy composition, the "35Bi" indicates Sn-35Bi-0.5Cu-0.03Ni (the composition used in Example 1 and Comparative Example 1), the "58Bi" indicates Sn-58Bi (the composition used in Example 2 and Comparative Example 2), and the "70Bi" indicates Sn-70Bi-0.5Cu-0.03Ni (the composition used in Example 3 and Comparative Example 3). The "sight1", the "sight2", and the "sight3" represent the respective three regions selected from the breakage surface of the solder joint, and the "Ave." represents the average of values in each alloy composition. As shown in FIG. 1, by optimizing the reflow profile, the proportion of the average of the number of Bi phases each having an area of 0.5 $\mu m^2$ or less in the average of the number of Bi phases each having an area of 5 $\mu m^2$ or less became high in the present examples, regardless of the solder alloy composition.

Figure 2A:
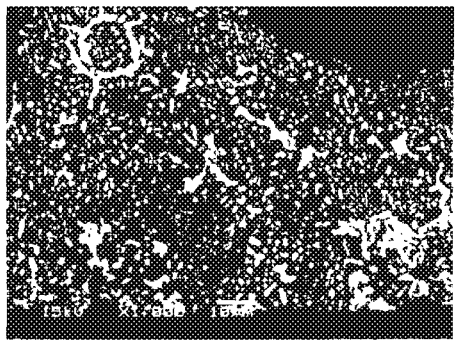
FIGS. 2A to 2F shows SEM photographs of the breakage surfaces of the respective solder joints obtained by changing the alloy composition of the solder alloy formed on the electrode of the circuit board and the temperature profile at the time of reflow.
Figure 2B:
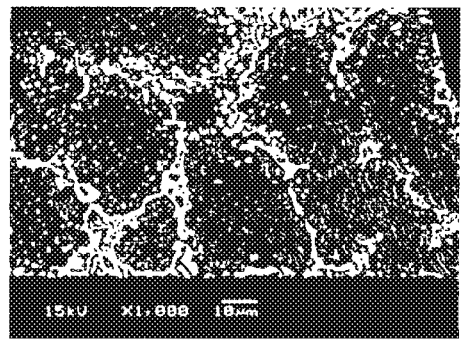
Figure 2C:
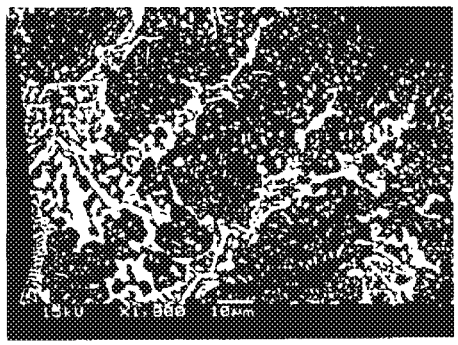
Figure 2D:
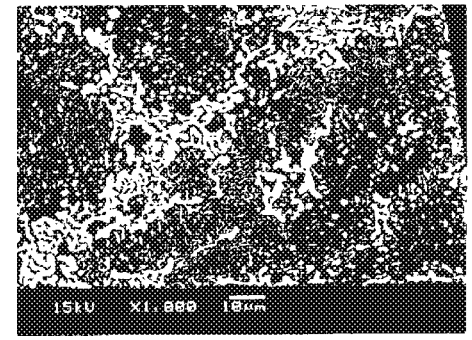
Figure 2E:
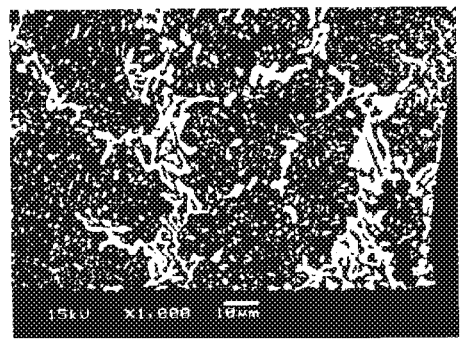
Figure 2F:
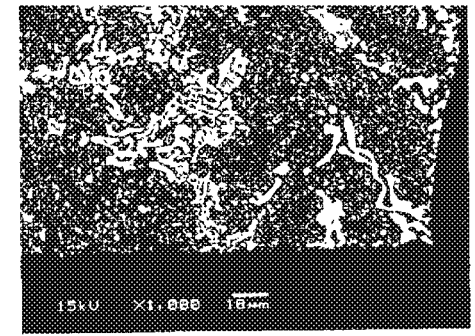

Photographs of the breakage surfaces of the solder joints formed in the above-described manner are shown. FIGS. 2A to 2F shows SEM photographs of the breakage surfaces of the respective solder joints obtained by changing the alloy composition of the solder alloy formed on the electrode of the circuit board and the temperature profile at the time of reflow. FIG. 2A is an SEM photograph of the breakage surface of the solder joint formed under the conditions of Comparative Example 1. FIG. 2B is an SEM photograph of the breakage surface of the solder joint formed under the conditions of Example 1. FIG. 2C is an SEM photograph of the breakage surface of the solder joint formed under the conditions of Comparative Example 2. FIG. 2D is an SEM photograph of the breakage surface of the solder joint formed under the conditions of Example 2. FIG. 2E is an SEM photograph of the breakage surface of the solder joint formed under the conditions of Comparative Example 3. FIG. 2F is an SEM photograph of the solder joint formed under the conditions of Example 3.

In FIGS. 2A to 2F, the white part is the Bi phase. As shown in FIGS. 2B, 2D and 2F, in Examples 1 to 3 in which the reflow profiles were optimized, the fine Bi phases could be observed. In contrast, as shown in FIGS. 2A, 2C and 2E, in Comparative Examples 1 to 3, each of Bi phases had a large area and was coarse as a whole compared with Examples 1 to 3. The same results were obtained in other examples and comparative examples. In Examples 1 to 3, it is considered that the results exceeding 100000 cycles in the repeated bending test were obtained by making the structure of the solder alloy constituting the solder joint fine and relaxing the stress.

Figure 3:
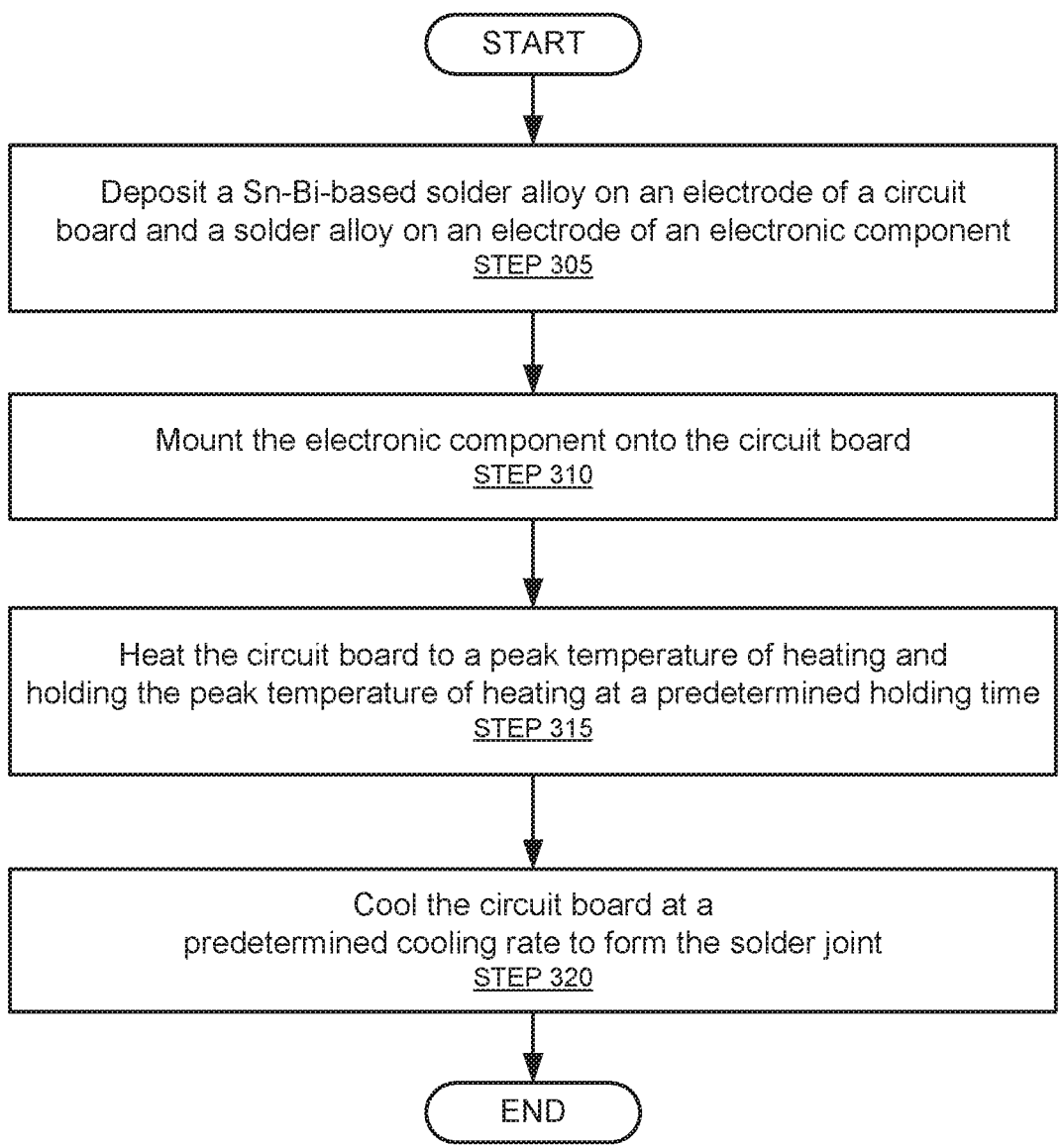
FIG. 3 shows a flowchart according to one or more embodiments.

FIG. 3 shows a flowchart according to one or more embodiments. Specifically, the flowchart depicts the method for forming a solder joint between an electrode of a circuit board and an electrode of an electronic component discussed above. The scope of the invention should not be considered limited to the specific arrangement of steps shown in FIG. 3.

In STEP 305, as discussed above, a Sn—Bi based solder alloy is deposited on an electrode of a circuit board and a solder alloy is deposited on an electrode of an electronic component. In one or more embodiments, the melting point of the Sn—Bi-based solder alloy is lower than the melting point of the solder alloy deposited on the electrode of the electronic component.

In STEP 310, as discussed above, the electronic component is mounted onto the circuit board in order for the Sn—Bi-based solder alloy to contact the solder alloy deposited on the electronic component.

In STEP 315, as discussed above, the circuit board is heated to a peak temperature of heating and the peak temperature of heating is held at a predetermined holding time.

In STEP 320, as discussed above, the circuit board is cooled, after the heating, to a predetermined cooling rate in order to form the solder joint between the electrode of the circuit board and the electrode of the electronic component.

As described above, by forming the solder joint by the solder bonding method according to one or more embodiments, thermal damage to the circuit board and the electronic component can be reduced, and excellent connection reliability can be exhibited.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A solder bonding method that bonds, using a solder joint, an electrode of a circuit board to an electrode of an electronic component, the method comprising:
   depositing, on the electrode of the circuit board, an Sn—Bi-based solder alloy with a lower melting point than a solder alloy deposited on the electrode of the electronic component;
   mounting the electronic component on the circuit board such that the Sn—Bi-based solder alloy contacts the solder alloy on the electrode of the electronic component;
   heating the circuit board to a peak temperature of heating of 150° C. to 180° C.;
   holding the peak temperature of heating at a holding time of greater than 60 seconds and less than or equal to 150 seconds; and
   cooling, after the heating and to form the solder joint, the circuit board at a cooling rate greater than or equal to 3° C./sec, wherein
   fine Bi phases in the solder joint each have an area less than or equal to 0.5 µm$^2$, coarse Bi phases in the solder joint each have an area of greater than 0.5 µm$^2$ and less than or equal to 5 µm$^2$, and
   a proportion of the fine Bi phases among the fine Bi phases and the coarse Bi phases is greater than or equal to 60%.

2. The solder bonding method according to claim 1, wherein, in the solder joint, the peak temperature of heating is lower than a melting point of the solder alloy deposited on the electrode of the electronic component.

3. The solder bonding method according to claim 1, wherein the Sn—Bi-based solder alloy is at least one of an Sn—Bi solder alloy, an Sn—Bi—Cu solder alloy, an Sn—Bi—Ni solder alloy, an Sn—Bi—Cu—Ni solder alloy, an Sn—Bi—Ag solder alloy, or an Sn—Bi—Sb solder alloy.

4. The solder bonding method according to claim 1, wherein a Bi content in the Sn—Bi-based solder alloy is 30 to 80 mass %.

5. The solder bonding method according to claim 1, wherein the solder alloy deposited on the electrode of the electronic component is at least one of an Sn—Cu solder alloy, an Sn—Ag solder alloy, an Sn—Ag—Cu solder alloy, an Sn—Ag—Cu—Ni solder alloy, an Sn—Ag—Cu—Sb solder alloy, or an Sn—Ag—Cu—Ni—Sb solder alloy.

6. The solder bonding method according to claim 1, wherein a temperature difference between a melting point of the Sn—Bi-based solder alloy and a melting point of a solder alloy deposited on the electrode of the electronic component is greater than or equal to 30° C.

7. The solder bonding method according to claim 1, wherein the Sn—Bi-based solder alloy contains 58 mass % of Bi and a balance of Sn.

* * * * *